United States Patent
Jung

(10) Patent No.: US 8,253,887 B2
(45) Date of Patent: Aug. 28, 2012

(54) BACKLIGHT UNIT AND LIQUID CRYSTAL DISPLAY DEVICE HAVING THE SAME

(75) Inventor: Myung Woo Jung, Gyeongbuk (KR)

(73) Assignee: LG Display Co., Ltd., Seoul (KR)

( * ) Notice: Subject to any disclaimer, the term of this patent is extended or adjusted under 35 U.S.C. 154(b) by 219 days.

(21) Appl. No.: 12/575,215

(22) Filed: Oct. 7, 2009

(65) Prior Publication Data

US 2010/0141865 A1    Jun. 10, 2010

(30) Foreign Application Priority Data

Dec. 4, 2008    (KR) .................. 10-2008-0122779

(51) Int. Cl.
*G02F 1/1335*    (2006.01)
(52) U.S. Cl. ............................. 349/65; 349/61
(58) Field of Classification Search .................. None
See application file for complete search history.

(56) References Cited

U.S. PATENT DOCUMENTS

| | | | |
|---|---|---|---|
| 2003/0071941 A1* | 4/2003 | Mizuno | ............... 349/96 |
| 2006/0232999 A1 | 10/2006 | Chang et al. | |
| 2007/0091242 A1 | 4/2007 | Oohira | |
| 2007/0222911 A1 | 9/2007 | Murase | |
| 2009/0322983 A1* | 12/2009 | Hashino | ............... 349/61 |

FOREIGN PATENT DOCUMENTS

JP        2007280620 A        10/2007

OTHER PUBLICATIONS

Office Action (w/English translation) from German Patent and Trademark Office dated Nov. 17, 2011 in German counterpart application.

* cited by examiner

*Primary Examiner* — Lucy Chien
(74) *Attorney, Agent, or Firm* — Morgan, Lewis & Bockius LLP

(57) ABSTRACT

A backlight unit preventing the lift-off of an FPC is disclosed. The backlight unit includes a plurality of light emitting diodes configured to emit light, a flexible printed circuit board on which the plurality of light emitting diodes are mounted, a light guide plate configured to be parallel to the plurality of light emitting diodes, a support main formed of a mold having a rectangular frame shape and configured to accommodate the plurality of light emitting diodes and the light guide plate, and a fixing tape configured to fix the flexible printed circuit board, the support main, and the light guide plate, wherein one side of the fixing tape is attached to the flexible printed circuit board, the other side of the fixing tape is attached to the support main and the light guide plate, and a "T" shape structure is formed between the plurality of light emitting diodes.

12 Claims, 3 Drawing Sheets

BACKLIGHT UNIT AND LIQUID CRYSTAL DISPLAY DEVICE HAVING THE SAME

CROSS-REFERENCE TO RELATED APPLICATION

This application claims priority under 35 U.S.C. 119 to Korean Patent Application No. 10-2008-0122779, filed on Dec. 4, 2008, which is hereby incorporated by reference in its entirety.

BACKGROUND

1. Field of the Disclosure

This disclosure relates to a backlight unit, and more particularly to a backlight unit which can prevent a flexible printed circuit board (FPC) from being lifted off, and a liquid crystal display (LCD) device having the backlight unit.

2. Description of the Related Art

In general, cathode ray tubes (CRTs) that are one of widely used display devices are mainly used as TVs or monitors for measuring apparatuses and information terminals. However, the CRT is not suitable for the miniaturization and lightness of electronic products due to its size and weight.

In contrast, LCD devices are compact and light and consume low power, compared to the CRT. In particular, since LCD devices using thin film transistors (TFTs) exhibit a high quality display, a large screen size, and a color quality equivalent to the CRT, the LCD devices are widely used in many fields such as laptop PCs or monitors.

The LCD device includes a LCD module, a bottom cover support a rear surface of the LCD module, and a top case coupled to the bottom cover and fixing the LCD module. The LCD module includes a LCD panel for displaying an image, a flexible printed circuit board (FPC) provided at a side of the LCD panel, and a backlight unit arranged at a rear surface of the LCD panel to provide light.

The backlight unit under the LCD panel includes another FPC on which a plurality of light emitting diodes (LEDs) are mounted. Another FPC is accommodated at a side of a support main which is formed of a mold having a rectangular frame shape. A light guide plate and optical sheets are accommodated in the support main parallel to the LEDs.

Another FPC is fixed at the side of the support main using a fixing tape. A light shield tap is arranged between the LCD panel and the backlight unit to fix the LCD panel and the backlight unit. One end of the FPC is rotated by 180° to be electrically connected to a backlight driver that is provided at the rear surface of the backlight unit.

However, in a general compact LCD device configured as above, although the fixing tape is attached between another FPC and the support main, a lift-off phenomenon may be generated due to a repulsive force of another FPC. In a general compact LCD device, when another FPC is lifted off, light leakage may be generated in an area when the lift-off is generated.

BRIEF SUMMARY

Accordingly, the present embodiments are directed to a backlight unit that substantially obviates one or more of problems due to the limitations and disadvantages of the related art, and an LCD device having the same.

An object of the present embodiment is to provide a backlight unit which enables an FPC to be lifted-off, thereby preventing a light leakage phenomenon.

Another object of the present embodiment is to provide an LCD device which enables an FPC to be lifted-off, thereby preventing a light leakage phenomenon.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a backlight unit includes a plurality of light emitting diodes configured to emit light, a flexible printed circuit board on which the plurality of light emitting diodes are mounted, a light guide plate configured to be parallel to the plurality of light emitting diodes, a support main formed of a mold having a rectangular frame shape and configured to accommodate the plurality of light emitting diodes and the light guide plate, and a fixing tape configured to fix the flexible printed circuit board, the support main, and the light guide plate, wherein one side of the fixing tape is attached to the flexible printed circuit board, the other side of the fixing tape is attached to the support main and the light guide plate, and a "T" shape structure is formed between the plurality of light emitting diodes.

An LCD device according to another general aspect of the present embodiment includes: an LCD panel, a plurality of light emitting diodes configured to emit light toward the LCD panel, a flexible printed circuit board on which the plurality of light emitting diodes are mounted, a light guide plate configured to be parallel to the plurality of light emitting diodes, a support main formed of a mold having a rectangular frame shape and configured to accommodate the plurality of light emitting diodes and the light guide plate, and a fixing tape configured to fix the flexible printed circuit board, the support main, and the light guide plate, wherein one side of the fixing tape is attached to the flexible printed circuit board, the other side of the fixing tape is attached to the support main and the light guide plate, and a "T" shape structure is formed between the plurality of light emitting diodes.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
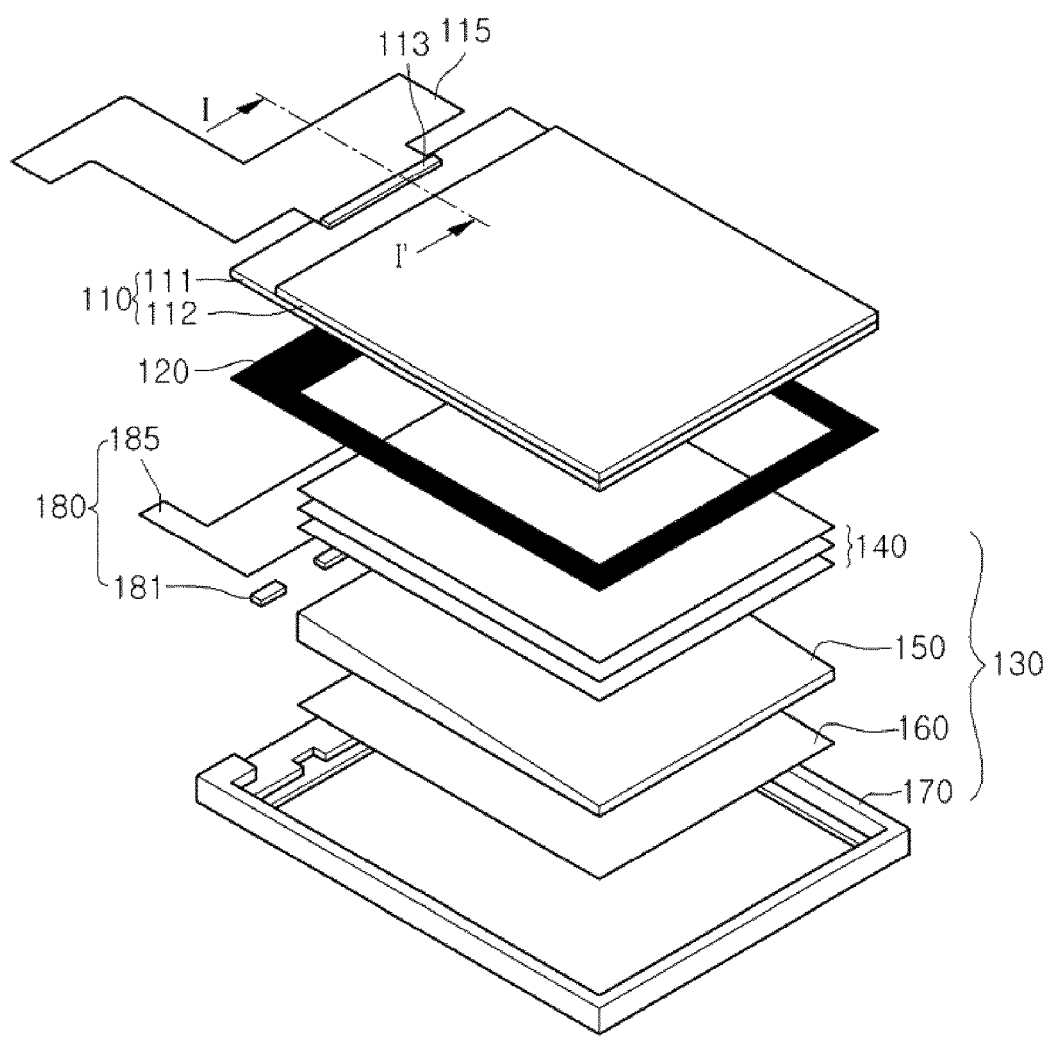
FIG. 1 is an exploded perspective view of a compact LCD device according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 2:
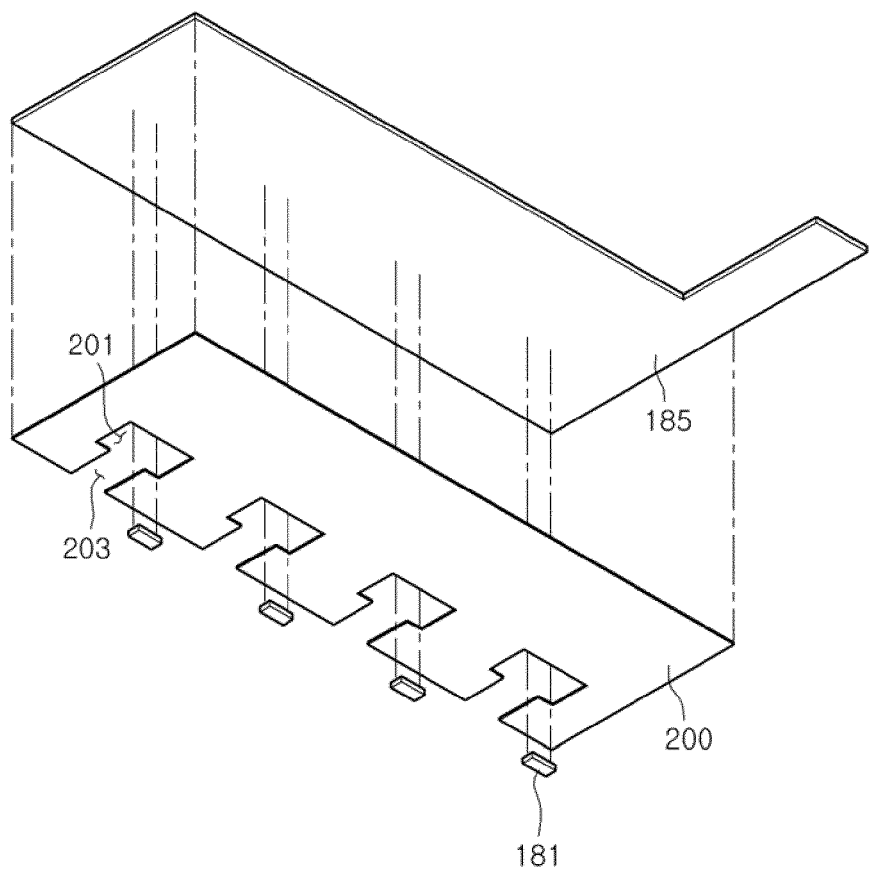
FIG. 2 is a perspective view of the FPC and the adhesive tape.
Figure 3:
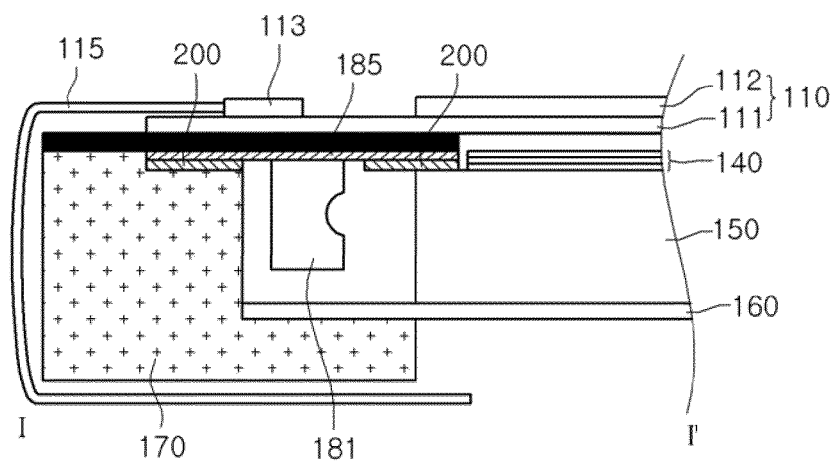
FIG. 3 is a cross-sectional view of the compact LCD device, taken along line I-I' of FIG. 1.

FIG. 1 is an exploded perspective view of a compact LCD device according to an embodiment of the present disclosure. FIG. 2 is a perspective view of the FPC and the adhesive tape. FIG. 3 is a cross-sectional view of the compact LCD device, taken along line I-I' of FIG. 1.

Referring to FIGS. 1-3, a compact LCD device according to an embodiment of the present disclosure includes an LCD panel 110 for displaying an image and a backlight unit 130 arranged under the LCD panel 110 to provide light. A first flexible printed circuit board (FPC) 115 is provided at an edge of the LCD panel 110 to apply an external data signal and control signal.

The firs FPC 115 is a circuit board obtained by forming a complicated circuit on a flexible insulation film and is formed of a heat-resistant plastic film such as polyester (PET) or polyimide (PI) which is a soft material. The first FPC 115 is widely used for compact LCD modules due to its flexibility which enables an efficient use of space and 3-D wiring.

A driving driver 113 is mounted in an area where the LCD panel 110 and the first FPC 115 are grounded. The LCD panel 110 receives an external signal from the first FPC 115. The driving driver 113 generates a driving signal driving the LCD panel 110 using the external signal.

The LCD panel 110 includes a thin film transistor (TFT) substrate 111, a color filter substrate 112 arranged to face the TFT substrate 111, and liquid crystal (not shown) interposed between the TFT substrate 111 and the color filter substrate 112. One end of the TFT substrate 111 extends longer than one end of the color filter substrate 112. Thus, the driving driver 113 in form of a chip may be mounted on one end of the TFT substrate 111.

The backlight unit 130 arranged on the rear surface of the LCD panel 110 includes a light source unit 180 arranged at one side thereof to emit light, a light guide plate 150 arranged parallel to the light source unit 180 to convert a point light to a surface light, a plurality of optical sheets 140 arranged on the light guide plate 150 to diffuse and focus the light emitted from the light guide plate 150, and a reflection sheet 160 arranged on the rear surface of the light guide plate 150 to reflect the light emitted downwardly from the light guide plate 150 toward the LCD panel 110.

The backlight unit 130 further includes a support main 170 that is formed of a mold having a rectangular frame shape to accommodate the light source unit 180, the light guide plate 150, the optical sheets 140, and the reflection sheet 160. A light shield tape 120 is arranged on the support main 170 to fix the light source unit 180, the light guide plate 150, the optical sheets 140, and the reflection sheet 160 so as not to be detached from the support main 170 and simultaneously to fix the LCD panel 110.

Both sides of the light shield tape 120 are coated with an adhesive material to fix the backlight unit 130 and the LCD panel 110. The overall surface of the light shield tape 120 is black so that the light emitted from the backlight unit 130 may be prevented from leaking to the outside.

When the backlight unit 130 and the LCD panel 110 are assembled using the light shield tape 120, the first FPC 115 is bent by 180° to be arranged on a lower surface of the support main 170.

The light guide plate 150 is formed of a poly methyl methacrylate (PMMA) and may have a wedge shape such that the thickness thereof decreases away from an incident surface where the light source unit 180 is arranged, although not illustrated in the drawings. A prism pattern for refracting an incident light to proceed toward the optical sheets 140 may be formed on the rear surface of the light guide plate 150.

The optical sheets 140 include a diffuser sheet for diffusing light, a focus sheet for focusing light, and a protection sheet for protecting the focus sheet. The light source unit 180 includes a second FPC 185 on which wiring is formed and a plurality of light emitting diodes (LEDs) 181 arranged on a lower surface of the second FPC 185 in a constant interval. The second FPC 185 is a circuit board obtained by forming a complicated circuit on a flexible insulation film and is formed of a heat-resistant plastic film such as polyester (PET) or polyimide (PI) which is a soft material.

A fixing tape 200 for fixing the second FPC 185 to the support main 170 and the light guide plate 150 corresponding to all areas, except for an area in which the LEDs 181 are arranged and an area in which the light from the LEDs 181 proceeds, is formed on a lower surface of the second FPC 185. In the fixing tape 200, a first groove 201 is formed in the area where the LEDs 181 are arranged while a second groove 203 is formed in the area where the light emitted from the LEDs 181 proceeds.

The size of the first groove 201 is larger than that of the second groove 203 and the first and second grooves 201 and 203 are connected to each other. An area surrounding the first groove 201 contacts one side of an upper surface of the support main 170 while an area surrounding the second groove 203 contacts one side of an upper surface of the light guide plate 150.

Both sides of the fixing tape 200 are coated with an adhesive material. One surface of the fixing tape 200 contacts the second FPC 185 while the other surface contacts the light guide plate 150 and the support main 170. Since the fixing tape 200 exists in an area surrounding the incident surface of the LEDs 181, an area making surface contact with a side of the upper surface of the light guide plate 150 increases so that an adhesive force may be improved.

Figure 4:
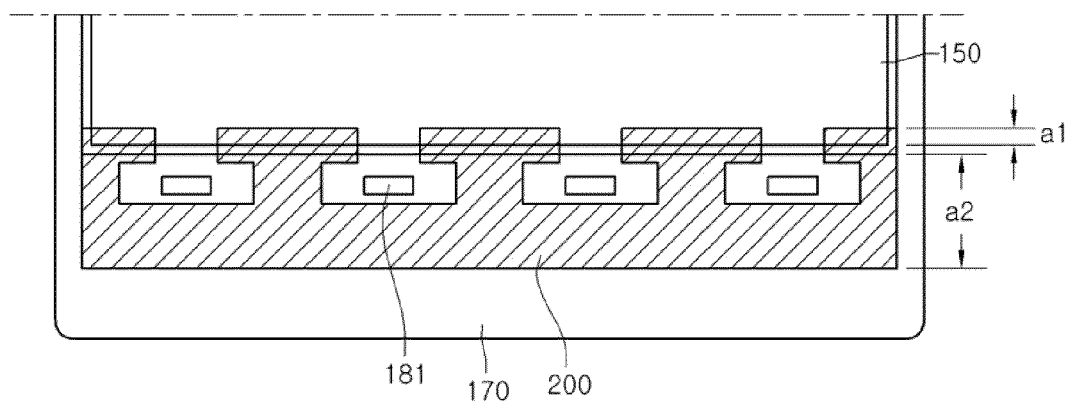
FIG. 4 is a plan view of a side of the backlight unit to which the fixing tape is attached, according to an embodiment of the present disclosure.

FIG. 4 is a plan view of a side of the backlight unit to which the fixing tape 200 is attached, according to an embodiment of the present disclosure. Referring to FIG. 4, the one side of the fixing tape 200 according to the present embodiment is attached to the lower surface of the second FPC (not shown) while the other side thereof is attached to the support main 170 and the light guide plate 150.

The fixing tape 200 is formed in a shape that the area in which the LEDs 181 are arranged and an area through which the light from the LEDs 181 is emitted are removed. An area at one side of the fixing tape 200 overlapping the light guide plate 150 is defined as a first region a1. The fixing tape 200 and the light guide plate 150 are attached in the first region a1 by making surface contact with each other. That is, the fixing tape 200 in the present embodiment has a "T" shaped structure between the LEDs 181. Accordingly, since the area in which the fixing tape 200 and the light guide plate 150 are attached increases, the lift-off of the second FPC (not shown) may be prevented.

An area at the other side of the fixing tape 200 overlapping the support main 170 is defined as a second area a2. The fixing tape 200 and the support main 170 are attached in the second area a2, by making surface contact with each other.

As described above, according to the LCD device according to the present embodiment, in the fixing tape 200 for fixing the second FPC 185, the light guide plate 150, and the support main 170, since the area adjacent to the LEDs 181 and the light guide plate 150 has a "T" shape, the contact area with the light guide plate 150 increases so that the lift-off of the second FPC 185 may be prevented.

Thus, the fixing tape 200 firmly fixing the second FPC 185 to the light guide plate 150 and the support main 170 may prevent a light leakage phenomenon due to the lift-off of the second FPC 185.

Figure 5:
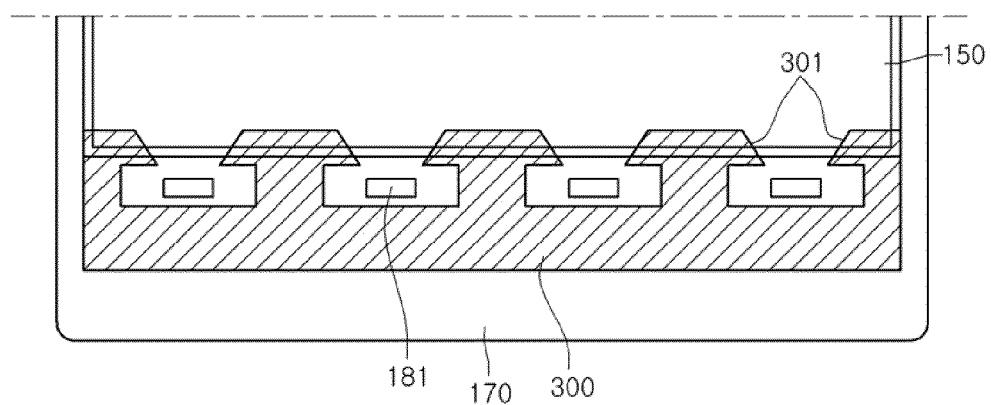
FIG. 5 is a plan view of a side of the backlight unit to which a fixing tape according to another embodiment of the present disclosure is attached.

FIG. 5 is a plan view of a side of the backlight unit to which a fixing tape 300 according to another embodiment of the present disclosure is attached. Referring to FIG. 5, one side of the fixing tape 300 is attached to the lower surface of the second FPC (not shown) while the other side thereof is attached to the support main 170 and the light guide plate 150. The fixing tape 300 is formed in a shape that the area in which the LEDs 181 are arranged and an area through which the light from the LEDs 181 is emitted are removed.

The fixing tape 300 located on the upper surface of the area where the light from the LEDs 181 is emitted has an inclined surface 301 inclined according to an exit angle of each of the LEDs 181. The inclined surface 301 is formed at the side of the fixing tape 300 to prevent irregular brightness of the light emitted from the LEDs 181 by being refracted by the fixing tape 300.

In other words, in the LCD device according to another embodiment, since the inclined surface 301 is formed at the side of the fixing tape 300 corresponding to the area in which the light of the LEDs 181 exits, not only the lift-off of the second FPC may be prevented, but also the generation of irregular brightness by the fixing tape 300 may be prevented.

As described above, according to the present disclosure, the fixing tape for fixing the FPC on which the LEDs are mounted, the light guide plate, and the support main has a T-shaped structure between the neighboring LEDs so that the contact area with the light guide plate increases. Thus, the lift-off of the FPC may be prevented.

According to the present disclosure, the fixing tap which can firmly fix the FPC to the light guide plate and the support main is provided so that a light leakage phenomenon due to the lift-off of the FPC may be prevented.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A backlight unit comprising:
a plurality of light emitting diodes configured to emit light;
a flexible printed circuit board on which the plurality of light emitting diodes are mounted;
a light guide plate disposed parallel to the plurality of light emitting diodes;
a support main formed of a mold having a rectangular frame shape to accommodate the plurality of light emitting diodes and the light guide plate; and
a fixing tape configured to fix the flexible printed circuit board, the support main, and the light guide plate,
wherein one side of the fixing tape is attached to the flexible printed circuit board, the other side of the fixing tape is attached to the support main and the light guide plate,
wherein the fixing tape has a plurality of "T" shape grooves that are formed between the plurality of light emitting diodes,
wherein the other side of the fixing tape is overlapped with a part of the light guide plate,
wherein the grooves are formed by removing a part of the fixing tape.

2. The backlight unit claimed as claim 1, wherein one end of the fixing tape is attached to one side of an upper surface of the light guide plate corresponding to an area except for a light exit surface of the plurality of light emitting diodes.

3. The backlight unit claimed as claim 1, wherein the fixing tape is attached to one side of an upper surface of the light guide plate corresponding to an area excluding a light exit angle of the plurality of light emitting diodes.

4. The backlight unit claimed as claim 3, wherein an inclined surface corresponding to the light exist angle of the plurality of light emitting diodes is provided to be at one side of the fixing tape.

5. The backlight unit claimed as claim 1, wherein the fixing tape comprises:
a first groove formed in an area corresponding to the plurality of light emitting diodes; and
a second groove formed in an area corresponding to a light exit surface of each of the plurality of light emitting diodes.

6. The backlight unit claimed as claim 5, wherein the first groove is larger than the second groove and the first and second grooves are connected to each other.

7. An LCD device comprising:
an LCD panel;
a plurality of light emitting diodes configured to emit light toward the LCD panel;
a flexible printed circuit board on which the plurality of light emitting diodes are mounted;
a light guide plate disposed parallel to the plurality of light emitting diodes;
a support main formed of a mold having a rectangular frame shape to accommodate the plurality of light emitting diodes and the light guide plate; and
a fixing tape configured to fix the flexible printed circuit board, the support main, and the light guide plate,
wherein one side of the fixing tape is attached to the flexible printed circuit board, the other side of the fixing tape is attached to the support main and the light guide plate,
wherein the fixing tape has a plurality of "T" shape grooves that are formed between the plurality of light emitting diodes,
wherein the other side of the fixing tape is overlapped with a part of the light guide plate,
wherein the grooves are formed by removing a part of the fixing tape.

8. The LCD device claimed as claim 7, wherein one end of the fixing tape is attached to one side of an upper surface of the light guide plate corresponding to an area except for a light exit surface of the plurality of light emitting diodes.

9. The LCD device claimed as claim 7, wherein the fixing tape is attached to one side of an upper surface of the light guide plate corresponding to an area excluding a light exit angle of the plurality of light emitting diodes.

10. The LCD device claimed as claim 9, wherein an inclined surface corresponding to the light exist angle of the plurality of light emitting diodes is provided to be at one side of the fixing tape.

11. The LCD device claimed as claim 7, wherein the fixing tape comprises:

a first groove formed in an area corresponding to the plurality of light emitting diodes; and a second groove formed in an area corresponding to a light exit surface of each of the plurality of light emitting diodes.

12. The LCD device claimed as claim 11, wherein the first groove is larger than the second groove and the first and second grooves are connected to each other.

* * * * *